(12) United States Patent
Jong et al.

(10) Patent No.: US 7,598,803 B2
(45) Date of Patent: Oct. 6, 2009

(54) COMBINED PHASE-LOCKED LOOP AND AMPLITUDE-LOCKED LOOP MODULE FOR SWITCHING FM SIGNALS

(75) Inventors: Gwo-Jia Jong, Kaohsiung (TW);
Jiun-Chiang Huang, Kaohsiung (TW)

(73) Assignee: National Kaohsiung University of Applied Sciences, Kaohsiung (TW)

( * ) Notice: Subject to any disclaimer, the term of this patent is extended or adjusted under 35 U.S.C. 154(b) by 92 days.

(21) Appl. No.: 11/964,178

(22) Filed: Dec. 26, 2007

(65) Prior Publication Data
US 2009/0167428 A1 Jul. 2, 2009

(51) Int. Cl.
H03D 3/00 (2006.01)
H03D 3/24 (2006.01)

(52) U.S. Cl. ................................ 329/325; 329/319

(58) Field of Classification Search ................ 329/315, 329/318, 319, 323, 325, 326; 360/29, 30; 375/324–328, 346, 349; 455/205, 208, 214, 455/260, 296, 312, 337
See application file for complete search history.

(56) References Cited

U.S. PATENT DOCUMENTS

| | | | |
|---|---|---|---|
| 5,341,106 A | 8/1994 | Pettigrew | |
| 5,999,025 A | 12/1999 | New | |
| 6,133,769 A | 10/2000 | Fontana et al. | |
| 6,177,844 B1 | 1/2001 | Sung et al. | |
| 6,218,876 B1 | 4/2001 | Sung et al. | |
| 6,271,729 B2 | 8/2001 | Sung et al. | |
| 6,356,127 B1 | 3/2002 | Klipper et al. | |
| 6,356,129 B1 | 3/2002 | O'Brien et al. | |
| 6,356,158 B1 | 3/2002 | Lesea | |
| 6,437,650 B1 | 8/2002 | Sung et al. | |
| 6,469,553 B1 | 10/2002 | Sung et al. | |
| 6,542,040 B1 | 4/2003 | Lesea | |
| 6,680,644 B2 | 1/2004 | Cole | |
| 6,703,875 B1 | 3/2004 | Chuang | |
| 6,710,635 B1 | 3/2004 | Wilson | |
| 6,771,715 B1 | 8/2004 | Rives et al. | |
| 6,801,092 B1 | 10/2004 | Moloudi | |
| 6,812,688 B2 | 11/2004 | Tan et al. | |
| 6,998,922 B2 | 2/2006 | Jensen et al. | |
| 7,002,419 B2 | 2/2006 | Schmitt et al. | |
| 7,042,972 B2 | 5/2006 | Fahim | |
| 7,082,295 B2 | 7/2006 | Chien | |
| 7,095,992 B2 | 8/2006 | Kim et al. | |
| 7,148,758 B1 | 12/2006 | Ross et al. | |
| 7,170,965 B2 | 1/2007 | Chien | |
| 7,174,144 B2 | 2/2007 | Lin | |
| 7,206,369 B2 | 4/2007 | Findley et al. | |
| 7,253,692 B2 | 8/2007 | Azuma | |
| 7,271,644 B2 | 9/2007 | Lin et al. | |
| 2008/0063122 A1* | 3/2008 | Jong et al. ............... 375/350 |

* cited by examiner

*Primary Examiner*—David Mis
(74) *Attorney, Agent, or Firm*—Alan Kamrath; Kamrath & Associates PA

(57) ABSTRACT

A combined PLL and ALL module for switching FM signals includes a PLL unit and an ALL unit electrically connected therewith. The PLL unit is used to initially process FM signals received from a co-channel. Outputs of the PLL unit are sent to the ALL unit and processed therein. The PLL unit and the ALL unit are controlled to process the FM signals by adjusting the ratio of second amplitude to first amplitude to closely approach a predetermined value such that the two FM signals are switched.

6 Claims, 7 Drawing Sheets

COMBINED PHASE-LOCKED LOOP AND AMPLITUDE-LOCKED LOOP MODULE FOR SWITCHING FM SIGNALS

BACKGROUND OF THE INVENTION

1. Field of the Invention

The present invention relates to a combined phase-locked loop (PLL) and amplitude-locked loop (ALL) module for switching FM signals received from a co-channel. More particularly, the present invention relates to the combined phase-locked loop and amplitude-locked loop module implemented by using field programmable gate arrays (FPGAs).

2. Description of the Related Art

A phase-locked loop used in telecommunications, computer and consumer devices is well known to a person skilled in the art, and has been described in many U.S. patents. For example, the related U.S. patents include: U.S. Pat. No. 7,271,664, entitled "phase locked loop circuit;" U.S. Pat. No. 7,253,692, entitled "phase locked loop;" U.S. Pat. No. 7,206,369, entitled "programmable feedback delay phase-locked loop for high-speed input/output timing budget management and method of operation thereof;" U.S. Pat. No. 7,174,144, "calibration of a phase locked loop;" U.S. Pat. No. 7,170,965, entitled "low noise divider module for use in a phase locked loop and other applications;" U.S. Pat. No. 7,148,758, entitled "integrated circuit with digitally controlled phase-locked loop;" U.S. Pat. No. 7,095,992, entitled "phase locked loop calibration;" U.S. Pat. No. 7,082,295, entitled "on-chip loop filter for use in a phase locked loop and other applications;" U.S. Pat. No. 7,042,972, entitled "compact, low-power low-jitter digital phase-locked loop;" U.S. Pat. No. 7,002,419, entitled "metal programmable phase-locked loop;" U.S. Pat. No. 6,998,922, entitled "phase locked loop modulator calibration techniques;" U.S. Pat. No. 6,812,688, entitled "signal acquisition method and apparatus using integrated phase locked loop;" U.S. Pat. No. 6,801,092, entitled "phase locked loop that avoids false locking;" U.S. Pat. No. 6,771,715, entitled "demodulator using cordic rotator-based digital phase locked loop for carrier frequency correction;" U.S. Pat. No. 6,710,635, entitled "frequency and phase locked loop;" U.S. Pat. No. 6,703,875, entitled "device for emulating phase-locked loop and method for same;" U.S. Pat. No. 6,680,644, entitled "digital interpolation window filter for phase-locked loop operation with randomly jittered reference clock;" U.S. Pat. No. 6,542,040, entitled "phase-locked loop employing programmable tapped-delay-line oscillator;" U.S. Pat. No. 6,469,553, entitled "phase-locked loop circuitry for programmable logic devices;" U.S. Pat. No. 6,437,650, entitled "phase-locked loop or delay-locked loop circuitry for programmable logic devices;" U.S. Pat. No. 6,356,158, entitled "phase-locked loop employing programmable tapped-delay-line oscillator;" U.S. Pat. No. 6,356,129, entitled "low jitter phase-locked loop with duty-cycle control;" U.S. Pat. No. 6,356,127, entitled "phase locked loop;" U.S. Pat. No. 6,271,729, entitled "phase-locked loop or delay-locked loop circuitry for programmable logic devices;" U.S. Pat. No. 6,218,876, entitled "phase-locked loop circuitry for programmable logic devices;" U.S. Pat. No. 6,177,844, entitled "phase-locked loop or delay-locked loop circuitry for programmable logic devices;" U.S. Pat. No. 6,133,769, entitled "phase locked loop with a lock detector;" and U.S. Pat. No. 5,999,025, entitled "phase-locked loop architecture for a programmable logic device." Each of the above-mentioned U.S. patents is incorporated herein by reference for purposes including, but not limited to, indicating the background of the present invention and illustrating the state of the art.

An amplitude-locked loop also known in the art is constituted by a circuitry which embodies all the principles of the PLL but operates in the amplitude domain or real domain and not in the frequency or imaginary domain. For example, U.S. Pat. No. 5,341,106, issued to Pettigrew on Aug. 23, 1994, discloses a circuit using an amplitude-locked loop and a phase-locked loop to remove AM crosstalk from an FM signal, which is incorporated herein by reference for purposes including, but not limited to, indicating the background of the present invention and illustrating the state of the art.

With regard to the problematic aspects naturally occurring during the use of the PLL or ALL circuit, it cannot provide a function of exchanging or switching FM signals received from a co-channel while removing the effect of co-channel interference (CCI) and recovering the messages from carriers. Hence, there is a need for improving the function of the PLL or ALL circuit for providing the function of exchanging or switching FM signals received from a co-channel.

As is described in greater detail below, the present invention intends to provide a combined PLL and ALL module for switching FM signals received from a co-channel. The combined PLL and ALL module is preferably implemented by using FPGAs. The combined PLL and ALL module is controlled to process FM signals by adjusting the ratio of second amplitude to first amplitude to closely approach a predetermined value. Hence, FM signals are separated and switched by the combined PLL and ALL module in such a way as to mitigate and overcome the above problem.

SUMMARY OF THE INVENTION

The primary objective of this invention is to provide a combined PLL and ALL module for switching FM signals received from a co-channel. The combined PLL and ALL module is controlled to process FM signals by adjusting the ratio of second amplitude to first amplitude to closely approach a predetermined value "m." Hence, the combined PLL and ALL module of the present invention is successful in separating and switching FM signals at a crossover point—a singular point of m=1 for example.

Another objective of this invention is to provide the combined PLL and ALL module for switching at least two different FM signals by simply adjusting the ratio of second amplitude to first amplitude to closely approach a predetermined value in demodulation. Accordingly, switching the two different FM signals or monitoring one of the different FM signals in demodulation is unsuccessful unless using the combined PLL and ALL module to adjust the ratio of second amplitude to first amplitude. Hence, the FM signals can be protected in demodulation due to the fact that a demodulation process for the FM signals require operating the combined PLL and ALL module. Advantageously, the high performance of the combined PLL and ALL module of the present invention can significantly achieve a high degree of information security of the FM signals in communication.

Another objective of this invention is to provide the combined PLL and ALL module for switching at least two different FM signals by simply adjusting the ratio of second amplitude to first amplitude to closely approach a predetermined value in demodulation. Hence, a public key or a private key for use in data encryption and data decryption of the FM signals in communication can further be omitted due to the fact that the combined PLL and ALL module is applied. Advantageously, the high performance of the combined PLL and ALL module of the present invention can simplify the entire communication procedure for achieving the high security application of using FM transmission signals.

The combined PLL and ALL module in accordance with an aspect of the present invention includes a PLL unit and an ALL unit electrically connected therewith. The PLL unit is used to initially process FM signals received from a co-channel. Outputs of the PLL unit are sent to the ALL unit and processed therein. The PLL unit and the ALL unit are controlled to process the FM signals by adjusting the ratio of second amplitude to first amplitude to closely approach a predetermined value such that the two FM signals are switched.

In a separate aspect of the present invention, the predetermined value is approximately 1.

In a further separate aspect of the present invention, the PLL unit serially connects with the ALL unit.

In a yet further separate aspect of the present invention, the PLL unit and the ALL unit are implemented by FPGAs.

In a yet further separate aspect of the present invention, the combined PLL and ALL module further connects with a pair of filter units to demodulate outputs of the ALL unit.

In a yet farther separate aspect of the present invention, the filter units are selected from butterworth filters.

Further scope of the applicability of the present invention will become apparent from the detailed description given hereinafter. However, it should be understood that the detailed description and specific examples, while indicating preferred embodiments of the invention, are given by way of illustration only, since various will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
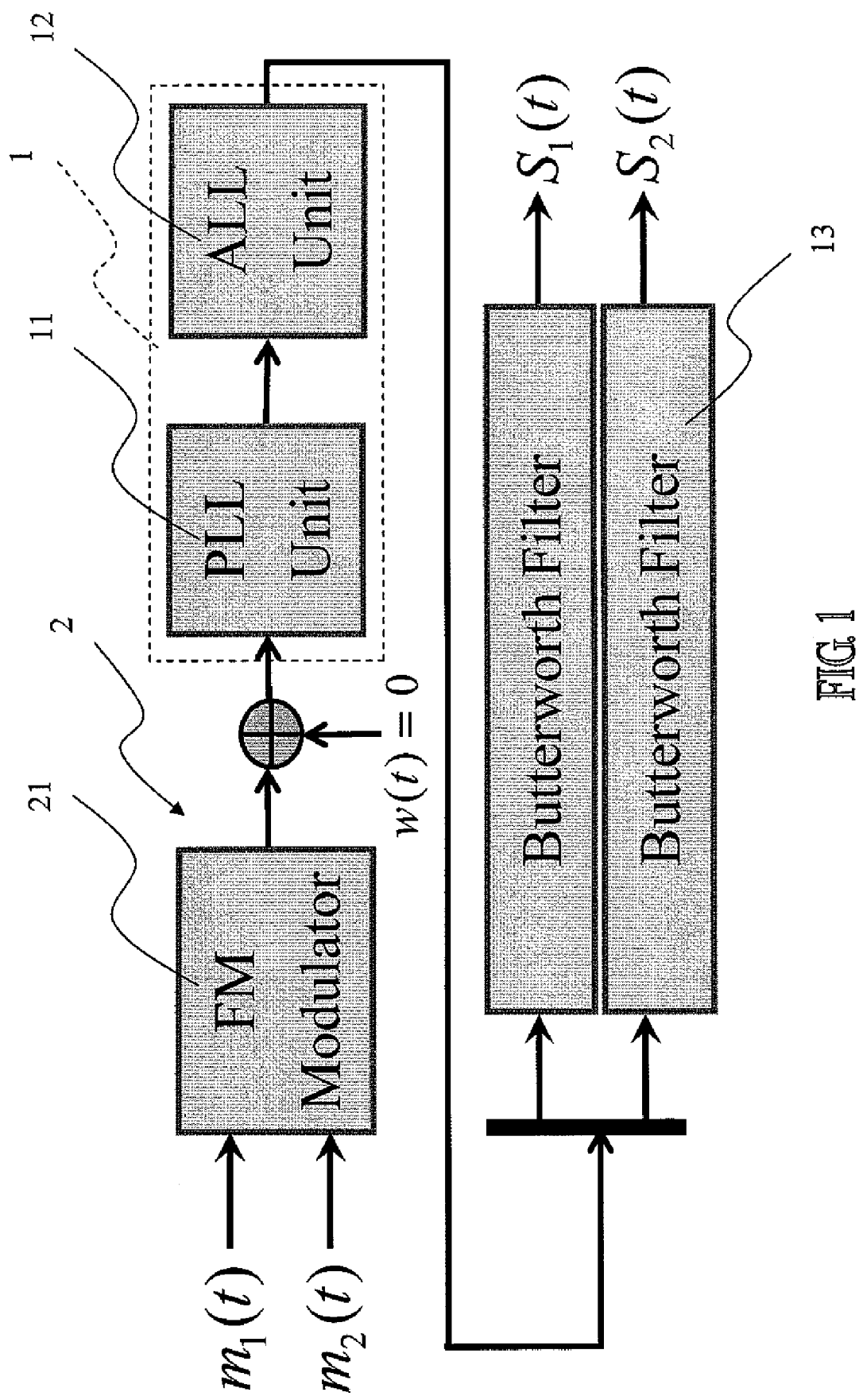
FIG. 1 is a block diagram of a combined PLL and ALL module for switching FM signals received from a co-channel in accordance with a preferred embodiment of the present invention.

Referring now to FIG. 1, blocks of a combined PLL and ALL module for switching FM signals received from a co-channel in accordance with a preferred embodiment of the present invention are shown. In FIG. 1, the combined PLL and ALL module of the present invention is designated numeral 1, and a FM signal generator applied in the preferred embodiment of the present invention is designated numeral 2. The combined PLL and ALL module 1 includes a PLL unit designated numeral 11 and an ALL unit designated numeral 12.

With continued reference to FIG. 1, the FM signal generator 2 can generate a series of FM signals transmitting to the combined PLL and ALL module 1 in a predetermined co-channel. The FM signal generator 2 includes a FM modulator 21 which can modulated a first signal $m_1(t)$ and a second signal $m_2(t)$. The FM signal generator 2 is operated to convert the first signal $m_1(t)$ and the second signal $m_2(t)$ into two FM signals for wireless communication.

Furthermore, a noise signal w(t) is added to the first signal $m_1(t)$ and the second signal $m_2(t)$ for interference simulation in the present invention. It will be understood that w(t)=0 defines no noise signal which may be added to the first signal $m_1(t)$ and the second signal $m_2(t)$ in the present invention. Subsequently, the two FM signals of the first signal $m_1(t)$ and the second signal $m_2(t)$ are transmitted to the combined PLL and ALL module 1.

Still referring to FIG. 1, the circuitry structure of the combined PLL and ALL module 1 shall be described. The PLL unit 11 electrically connects with the ALL unit 12 so as to process the two FM signals of the first signal $m_1(t)$ and the second signal $m_2(t)$. In a preferred embodiment, the combined PLL and ALL module 1 is designed to have the PLL unit 11 serially connecting with the ALL unit 12. Once received, the PLL unit 11 is used to initially process the two FM signals of the first signal $m_1(t)$ and the second signal $m_2(t)$ received from the co-channel, and to suppress the effect of co-channel interference (CCI) for recovering the first signal $m_1(t)$ and the second signal $m_2(t)$. Subsequently, outputs of the PLL unit 11 are sent to the ALL unit 12 and processed therein in order to enhance the removal of the effect of CCI.

Preferably, the PLL unit 11 and the ALL unit 12 are controlled to process the two FM signals of the first signal $m_1(t)$ and the second signal $m_2(t)$ by adjusting the ratio of second amplitude of the second signal $m_2(t)$ to first amplitude of the first signal $m_1(t)$ to closely approach a predetermined value. In the present invention, "m" is selected to define the predetermined value of the ratio of second amplitude of the second signal $m_2(t)$ to first amplitude of the first signal $m_1(t)$. Preferably, the value of "m" is approximately 1 which is a singular point formed as a crossover point of FM signals in communication.

In a preferred embodiment, the combined PLL and ALL module 1 further connects with a pair of filter units 13 for demodulating the FM signals. In another preferred embodiment, the filter units 13 are selected from butterworth filters. Accordingly, the combined PLL and ALL module 1 generates a first demodulated signal (identified as "$S_1(t)$") and a second demodulated signal (identified as "$S_2(t)$"). Prior to adjusting the combined PLL and ALL module 1, the two FM signals of the first signal $m_1(t)$ and the second signal $m_2(t)$ are processed and then separated into the first demodulated signal $S_1(t)$ and the second demodulated signal $S_2(t)$ respectively.

Figure 2:
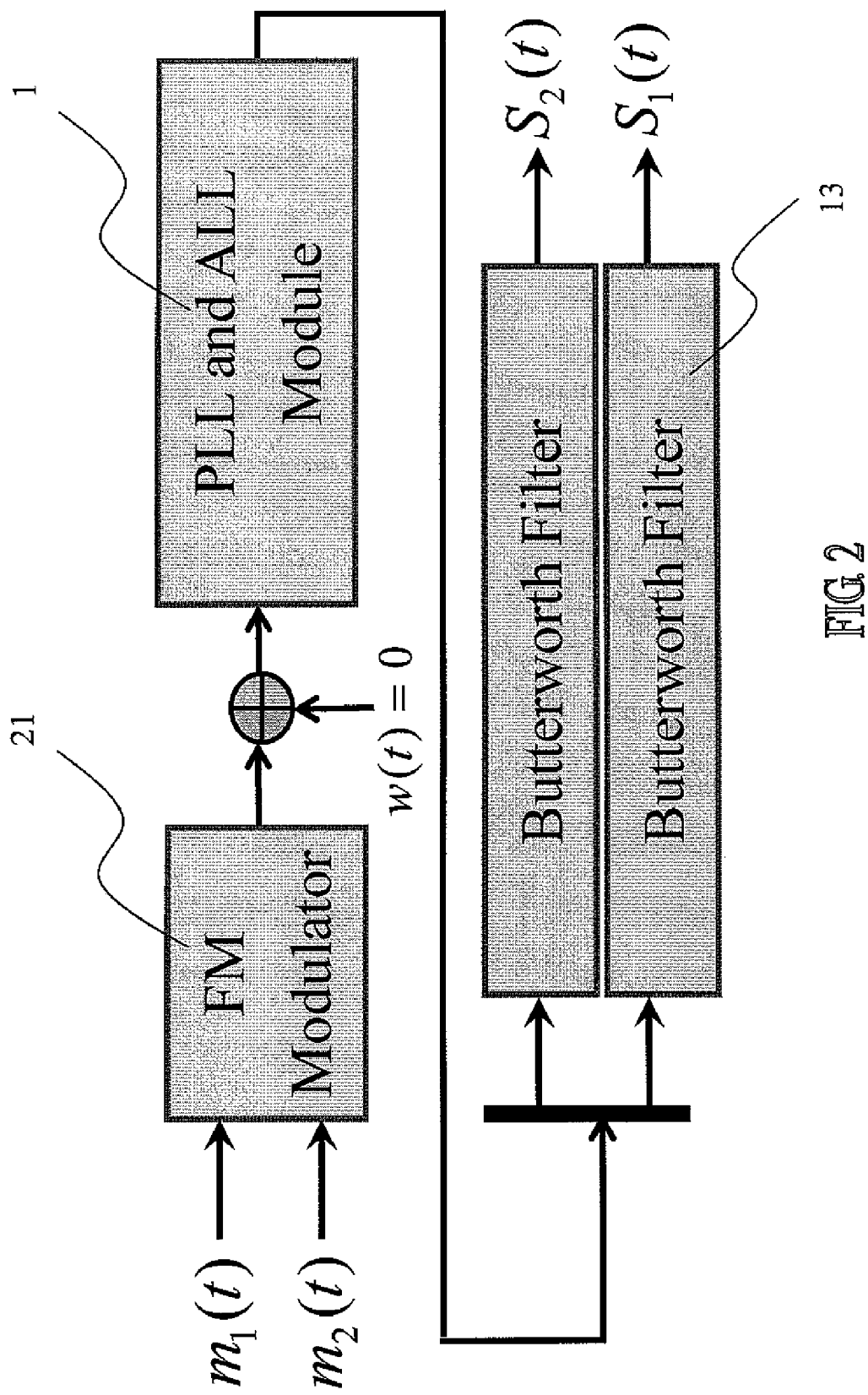
FIG. 2 is a block diagram of the combined PLL and ALL module in accordance with the preferred embodiment of the present invention while exchanging two output signals in adjusting operation.

Turning now to FIG. 2, a block diagram of the combined PLL and ALL module in accordance with the preferred embodiment of the present invention while exchanging two signals in adjusting operation. In adjusting the combined PLL and ALL module 1, for example, the value of "m" is 0.99999999999999999999,
where "m" is smaller than 1 and closely approaches 1; or
the value of "m" is 1.00000000000000000001,
where "m" is greater than 1 and closely approaches 1.

Referring to FIG. 2, once adjusted, the second demodulated signal $S_2(t)$ and the first demodulated signal $S_1(t)$ generated from the combined PLL and ALL module 1 are successfully exchanged. Referring back to FIG. 1, in comparing with those shown in FIG. 2, the first demodulated signal $S_1(t)$ and the second demodulated signal $S_2(t)$ generated from the combined PLL and ALL module 1 are not exchanged due to the fact that the value of "m" does not extremely approach 1.

As has been discussed above, the combined PLL and ALL module 1 in accordance with the present invention successfully provides the function of exchanging the first demodulated signal $S_1(t)$ and the second demodulated signal $S_2(t)$ by adjusting the value of "m". Hence, the second demodulated signal $S_2(t)$ and the first demodulated signal $S_1(t)$ are correspondingly obtained, as best shown in FIG. 2.

Referring again to FIGS. 1 and 2, in switching at least two different FM signals, the combined PLL and ALL module 1 must be applied to adjust the ratio of second amplitude to first amplitude closely approaching a predetermined value in demodulation. Accordingly, switching the first signal $m_1(t)$ to the second signal $m_2(t)$ and vice versa or monitoring one of the first signal $m_1(t)$ and the second signal $m_2(t)$ in demodulation is unsuccessful unless using the combined PLL and ALL module 1 for adjusting the ratio of second amplitude to first amplitude. Hence, the first signal $m_1(t)$ and the second signal $m_2(t)$ can be protected in demodulation due to the fact that a demodulation process for the first signal $m_1(t)$ and the second signal $m_2(t)$ require operating the combined PLL and ALL module 1. Advantageously, the high performance of the combined PLL and ALL module 1 of the present invention can significantly achieve a high degree of information security of the first signal $m_1(t)$ and the second signal $m_2(t)$ in communication.

In addition to this, a public key or a private key for use in data encryption and data decryption of the first signal $m_1(t)$ and the second signal $m_2(t)$ in communication may further be omitted by using the combined PLL and ALL module 1. It will be understood that the first signal $m_1(t)$ and the second signal $m_2(t)$ cannot be separated in other types of demodulators in the known art. In other words, a public key or a private key for use in data encryption and data decryption of the first signal $m_1(t)$ and the second signal $m_2(t)$ may be unnecessary. Advantageously, the high performance of the combined PLL and ALL module 1 of the present invention can simplify the entire communication procedure for the FM signals.

Figure 3A:
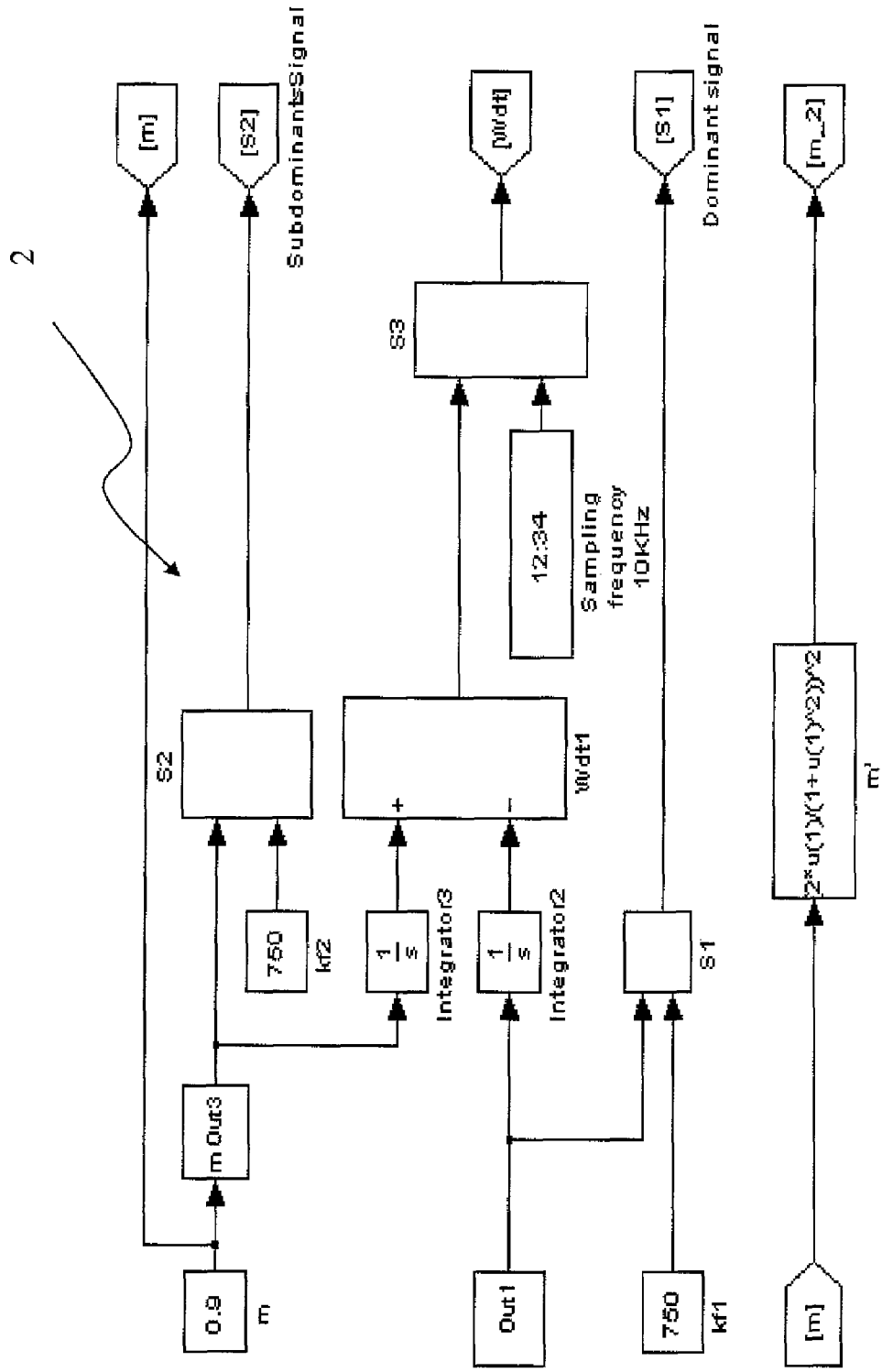
FIGS. 3A and 3B are left and right sides of a schematic circuit of the combined PLL and ALL module implemented by a design of FPGAa in accordance with a first embodiment of the present invention.
Figure 3B:
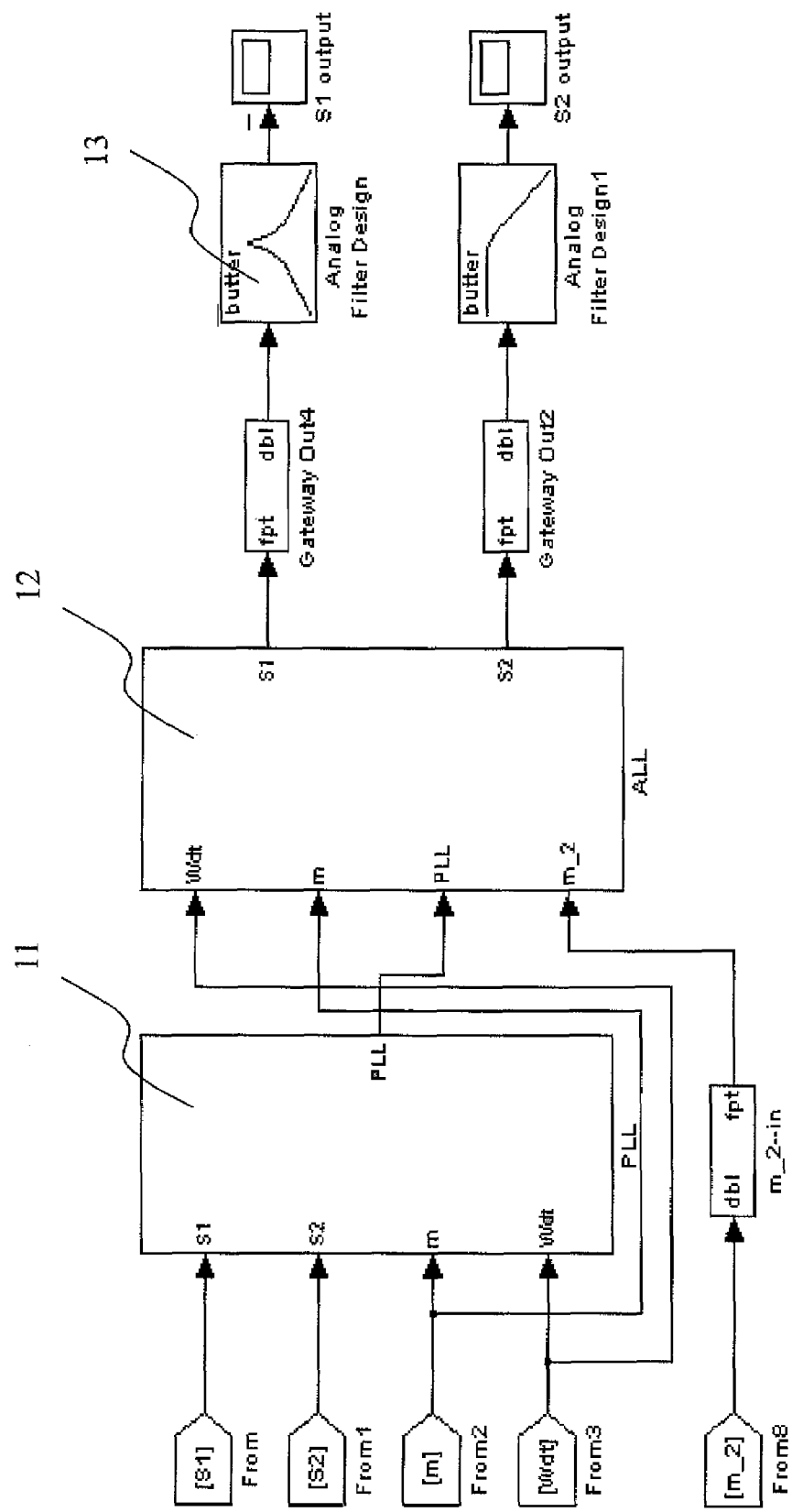

Turning now to FIG. 3, a schematic circuit of the combined PLL and ALL module implemented by a design of FPGAs in accordance with a first embodiment of the present invention is shown. The PLL unit 11 and the ALL unit 12 formed in the combined PLL and ALL module 1 are shown in the middle portion of FIG. 3. The FM signal generator 2 connected with the combined PLL and ALL module 1 is shown in the left portion of FIG. 3. Shown in the right portion of FIG. 3 are the two filter units 13 which are connected with the combined PLL and ALL module 1.

Figure 4A:
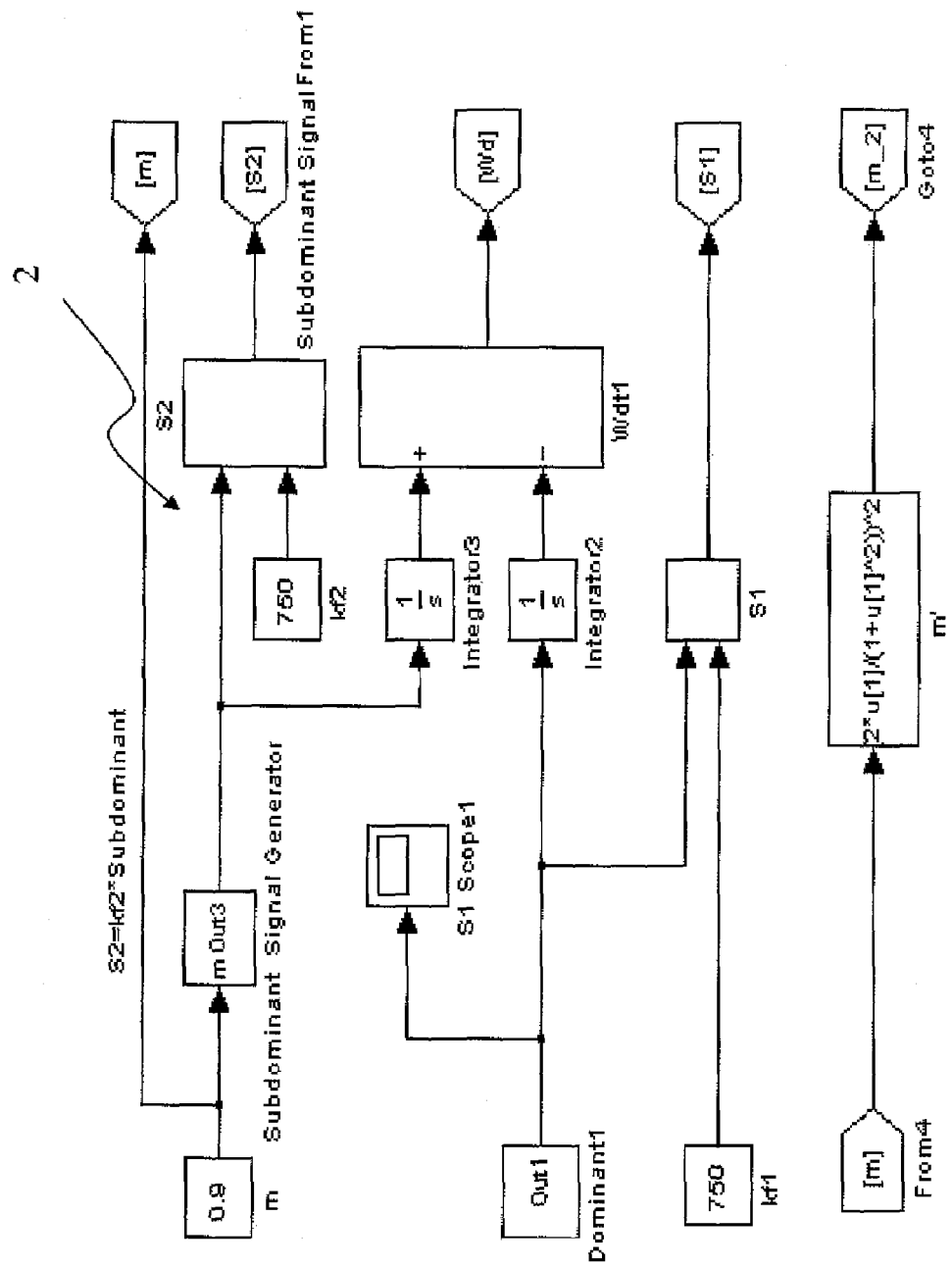
FIGS. 4A and 4B are left and right sides of a schematic circuit of the combined PLL and ALL module implemented by another design of FPGAs in accordance with a second embodiment of the present invention.
Figure 4B:
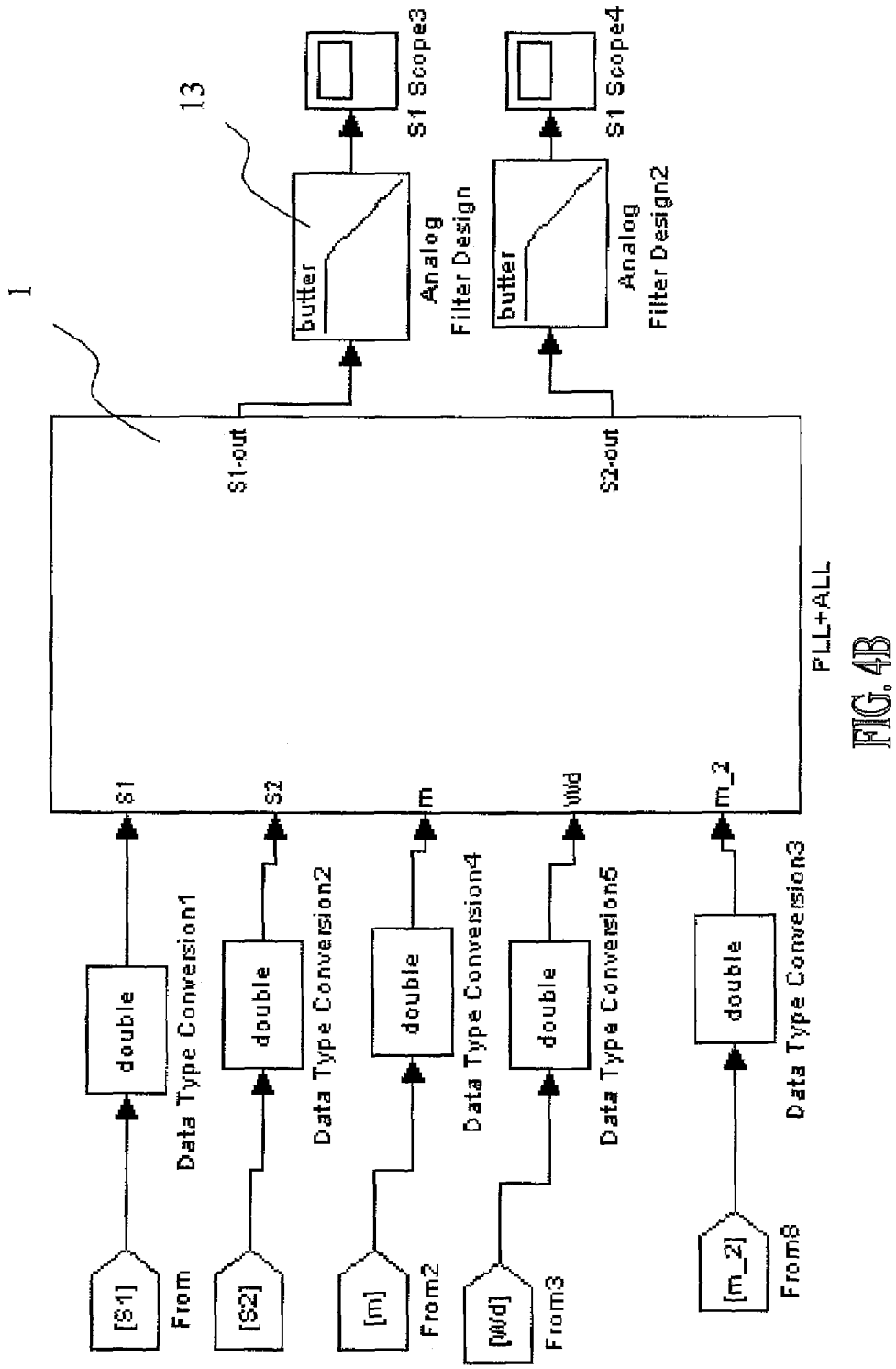

Turning now to FIG. 4, a schematic circuit of the combined PLL and ALL module implemented by another design of FPGAs in accordance with a second embodiment of the present invention is shown. The combined PLL and ALL module 1 is designed as a single chip, as best shown in the right portion of FIG. 4.

Figure 5:
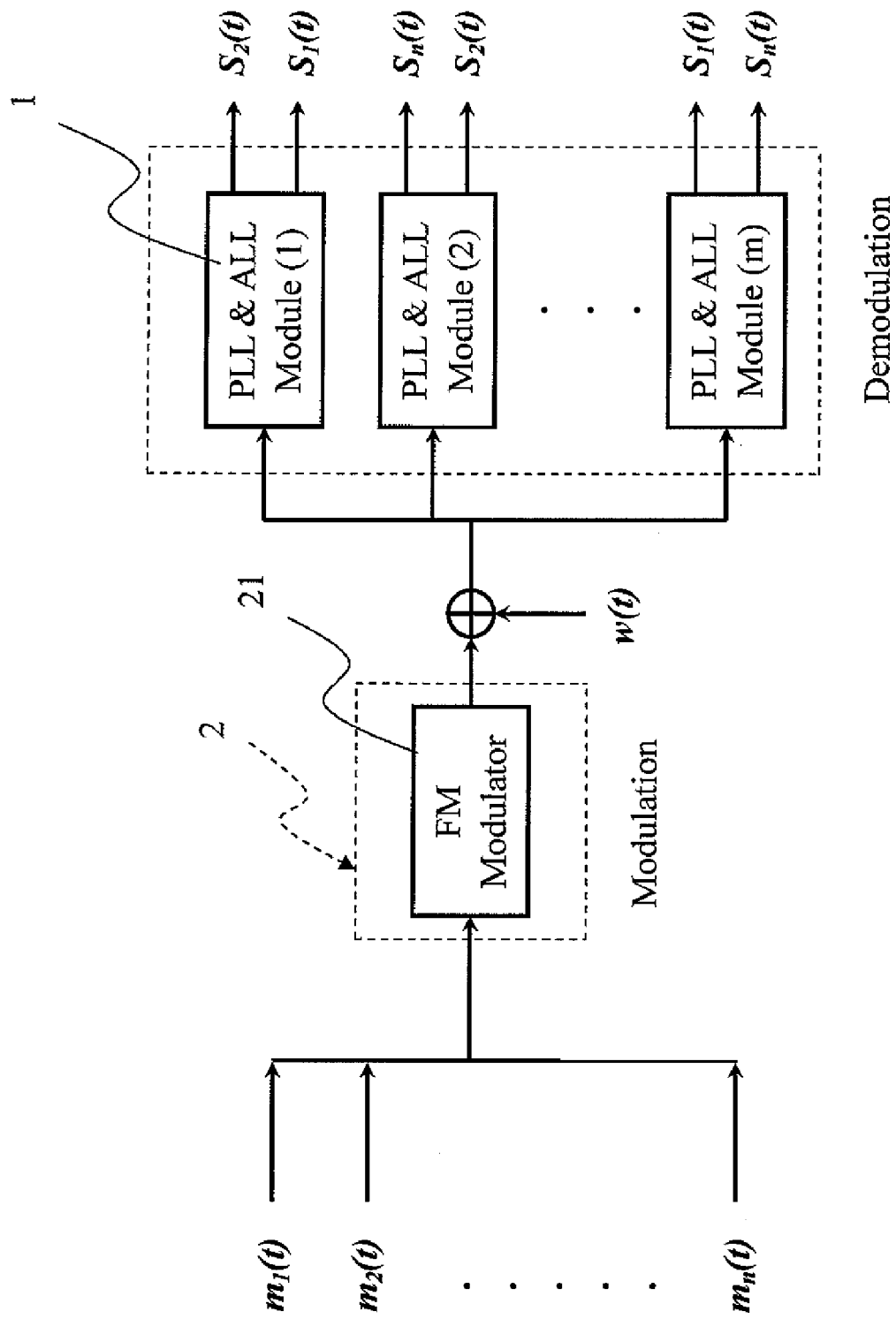
FIG. 5 is a block diagram of a series of the combined PLL and ALL modules in accordance with the preferred embodiment of the present invention while exchanging multiple output signals.

Turning now to FIG. 5, a block diagram of a series of the combined PLL and ALL modules in accordance with the preferred embodiment of the present invention is shown. A plurality of the combined PLL and ALL modules 1 are applied to demodulate different signals $m_1(t)$, $m_2(t)$, ..., $m_n(t)$ each of which possesses different power. In demodulation, the signals $m_1(t)$, $m_2(t)$, ..., $m_n(t)$ can be exchanged by selectively controlling one of the combined PLL and ALL modules 1.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A combined PLL and ALL module, comprising:
   a PLL unit used to initially process FM signals received from a co-channel; and
   an ALL unit electrically connecting with the PLL unit, outputs of the PLL unit being sent to the ALL unit and processed therein;
   wherein the PLL unit and the ALL unit are controlled to process the FM signals by adjusting the ratio of second amplitude to first amplitude to closely approach a predetermined value.

2. The combined PLL and ALL module as defined in claim 1, wherein the predetermined value is 1.

3. The combined PLL and ALL module as defined in claim 1, wherein the PLL unit serially connects with the ALL unit.

4. The combined PLL and ALL module as defined in claim 1, wherein the PLL unit and the ALL unit are implemented by FPGAs.

5. The combined PLL and ALL module as defined in claim 1, further connecting with a pair of filter units to demodulate outputs of the ALL unit.

6. The combined PLL and ALL module as defined in claim 5, wherein the filter units are selected from butterworth filters.

* * * * *